United States Patent
Barnette

(10) Patent No.: US 7,307,220 B2
(45) Date of Patent: Dec. 11, 2007

(54) CIRCUIT BOARD FOR CABLE TERMINATION

(75) Inventor: Christopher M. Barnette, Dallas, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/034,072

(22) Filed: Jan. 12, 2005

(65) Prior Publication Data

US 2006/0151200 A1    Jul. 13, 2006

(51) Int. Cl.
*H05K 1/03* (2006.01)

(52) U.S. Cl. .................... 174/255; 174/250; 174/256; 174/262; 361/780; 361/794; 257/691; 257/700

(58) Field of Classification Search ............... 174/250, 174/255, 256, 260–266; 361/780, 794; 257/691, 257/700
See application file for complete search history.

(56) References Cited

U.S. PATENT DOCUMENTS

| | | |
|---|---|---|
| 3,980,382 A | 9/1976 | Reeder |
| 4,821,150 A | 4/1989 | Duthie et al. |
| 4,941,831 A | 7/1990 | Tengler et al. |
| 4,971,569 A | 11/1990 | Gooch et al. |
| 5,351,001 A * | 9/1994 | Kornrumpf et al. ..... 324/158.1 |
| 5,538,433 A | 7/1996 | Arisaka |
| 5,801,541 A | 9/1998 | Rezvani |
| 5,839,910 A | 11/1998 | Meller et al. |
| 6,053,751 A | 4/2000 | Humphrey |
| 6,414,504 B2 | 7/2002 | Johnston |
| 6,441,319 B1 | 8/2002 | Handforth et al. |
| 6,753,679 B1 | 6/2004 | Kwong et al. |
| 6,765,298 B2 * | 7/2004 | Chin et al. .................. 257/776 |
| 6,776,659 B1 | 8/2004 | Stokoe et al. |
| 6,780,059 B1 | 8/2004 | Payne et al. |
| 6,800,814 B2 * | 10/2004 | Ohsaka ....................... 174/255 |
| 2004/0144562 A1* | 7/2004 | Ishikawa .................... 174/255 |
| 2004/0264153 A1* | 12/2004 | Payne et al. ................ 361/790 |

FOREIGN PATENT DOCUMENTS

| | | | |
|---|---|---|---|
| JP | 05029772 A | * | 2/1993 |
| JP | 07307578 A | * | 11/1995 |

* cited by examiner

*Primary Examiner*—Dean A. Reichard
*Assistant Examiner*—Hoa C. Nguyen

(57) ABSTRACT

Various embodiments of an apparatus, circuit board, and method are disclosed for cable termination. In one embodiment, a surface pad is disposed on a surface of the circuit board. A ground conductor is in the circuit board, the ground conductor being parallel to and collateral to the at least one surface pad. Also, at least one antipad is positioned between the at least one surface pad and the ground conductor, wherein a nonconductive volume extends from the surface pad to the ground conductor through the at least one antipad.

10 Claims, 7 Drawing Sheets

CIRCUIT BOARD FOR CABLE TERMINATION

BACKGROUND

Cables embodying new cable designs are often tested to verify electrical characteristics and losses associated with the cable. For example, one approach employed to test a cable is to launch an electrical signal through the cable to determine the characteristics of the cable based upon the losses experienced and other effects the cable has on the signal. Unfortunately, such an approach to test cables used for high frequency applications can present difficulties. If the signal launched through the cable is of a relatively high frequency, then problems are presented in determining how to launch a signal into the cable without unwanted reflection due to impedance mismatches. Specifically, impedance mismatches may exist between the cable and whatever test apparatus such as circuit boards or other apparatus that is coupled to the cable to facilitate launching the test signal into the cable. For example, if an impedance mismatch occurs between a cable and a probe or other structure there between, it may be the case that losses due to reflections are greater than losses due to the resistance of the cable. In such a case, an accurate determination of cable electrical characteristics may be difficult to obtain.

BRIEF DESCRIPTION OF THE DRAWINGS

The invention can be understood with reference to the following drawings. The components in the drawings are not necessarily to scale. Also, in the drawings, like reference numerals designate corresponding parts throughout the several views.

DETAILED DESCRIPTION

Figure 1:
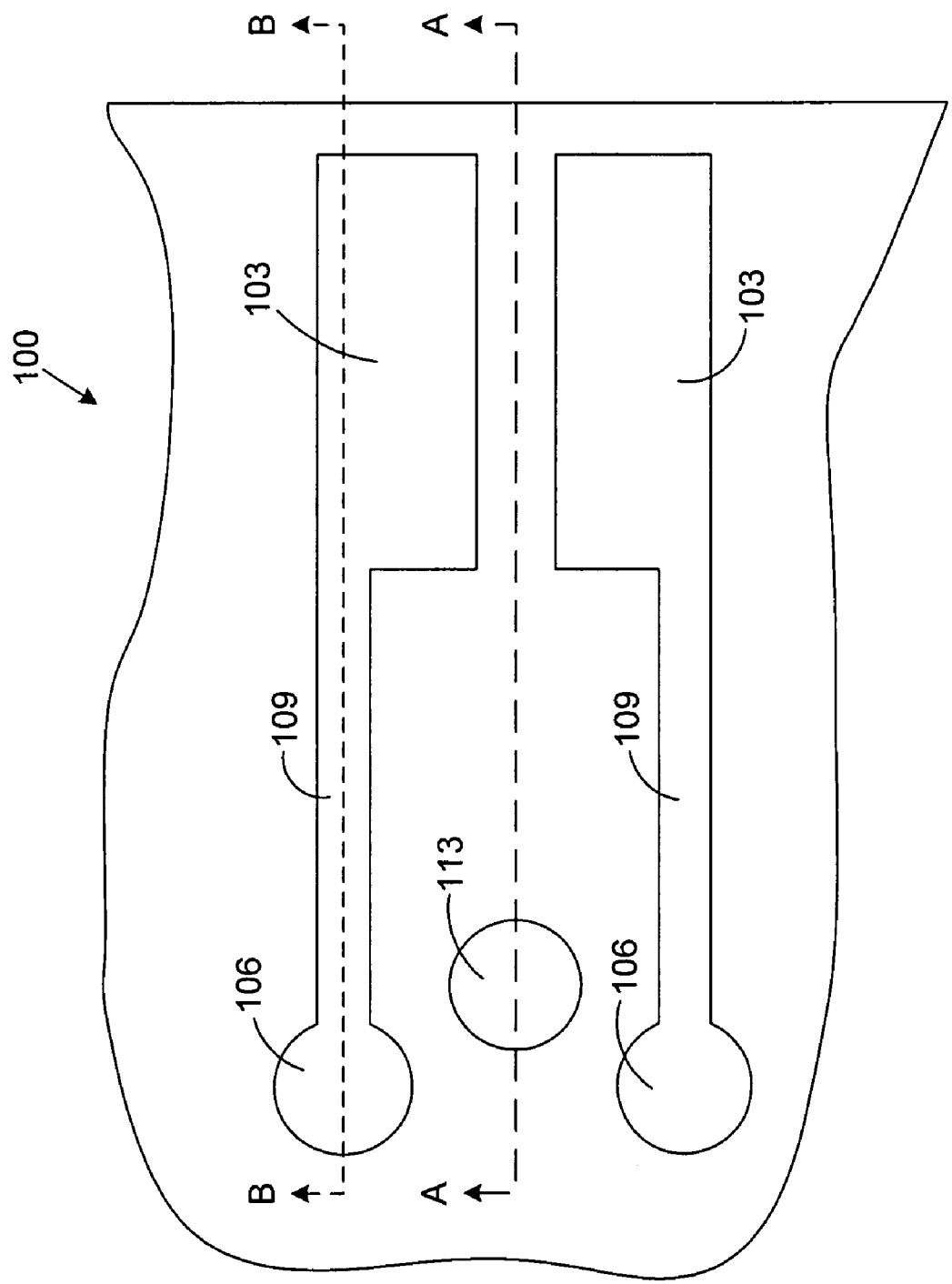
FIG. 1 is a drawing of a surface of a section of a circuit board having surface pads according to an embodiment of the present invention.

Referring to FIG. 1, shown is a section of a circuit board 100 according to an embodiment of the present invention. As will be described, the circuit board 100 provides for the electric coupling of a test probe to the conductors of a cable to be tested in a manner that minimizes any impedance mismatch between the cable and the conductors on the circuit board 100, thereby minimizing unwanted reflection of a test signal launched into the cable.

To this end, the circuit board 100 includes surface pads 103 and signal launch pads 106 on a first surface. Each signal launch pad 106 is coupled to one of the surface pads 103 by a lead 109. The surface pads 103 are employed to couple to conductors of a cable into which a test signal is to be launched to test the various electrical characteristics of the cable itself. The signal launch pads 106 are employed to couple to a test probe that is employed to generate the test signal that is launched into the cable coupled to the surface pads 103. The leads 109 bridge the electrical gap between the signal launch pads 106 and the surface pads 103. The test signal thus travels from the probe through the signal launch pads 106, the leads 109, and the surface pads 103, and into the cable as will be described.

In addition a ground signal launch pad 113 is also disposed in the surface of the circuit board 100. The ground signal launch pad 113 provides a location for a ground conductor of a probe to be coupled to the circuit board 100 to facilitate the launch of the signal into the cable as will be described.

Figure 2:
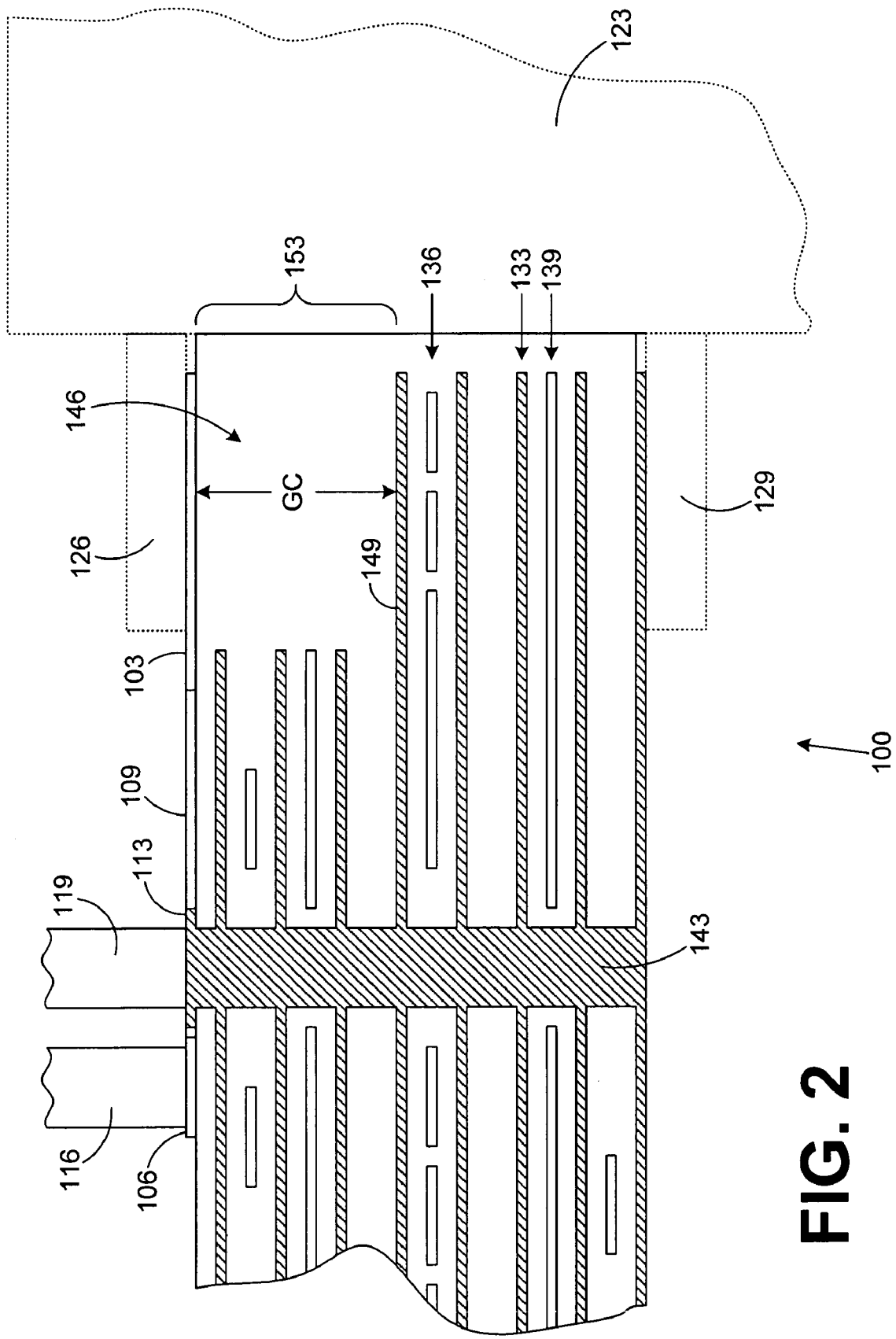
FIG. 2 is a drawing of a first cross-section of the section of the circuit board of FIG. 1 according to an embodiment of the present invention.

With reference to FIG. 2, shown is a cutaway view of the section of the circuit board 100 take along section line AA of FIG. 1 according to an embodiment of the present invention. In this respect, the section described is located at an edge of the circuit board 100 where a cable is attached. A signal conductor 116 of a test probe is shown in contact with the signal launch pad 106. Also, a ground conductor 119 of the test probe is shown in contact with the ground signal launch pad 113. Also depicted is a cable 123 (in phantom) that may be, for example, a coaxial cable, a duel coaxial cable, a twisted wire pair, or other type of cable, etc.

Extending from the cable 123 are one or more cable conductors 126 and a cable ground conductor 129. In this respect, each cable conductor 126 is coupled to a surface pad 103 and the cable ground conductor 129 is coupled to a ground conductor at the surface of the circuit board 100 opposite the surface on which the surface pads 103 are located. There may be any number of cable conductors 126. In the example depicted in FIG. 2, for example, the cable 123 is a dual coaxial cable with 2 cable conductors 126 as can be appreciated.

The circuit board 100 is a multiple layered circuit board. In this respect, the circuit board 100 includes multiple planes within which various conductors may be located. Various ones of the planes may comprise, for example, a ground plane 133 that generally comprises a solid sheet conductor extending over an entire area of the circuit board 100 with the exception of various antipads as can be appreciated. As shown, every other plane includes a ground plane 133 as will be described.

Alternatively, each of the planes may comprise, for example, a signal plane 136 that include traces and other conductive structures as can be appreciated by those with ordinary skill in the art. Finally, the planes may also comprise power planes 139 that may be a solid sheet conductor extending over the entire area of the circuit board 100 with the exception of various antipads as can be appreciated.

Even though ground planes 133 and power planes 139 may extend across the entire area of a circuit board 100, there may also be various antipads within these planes to allow for various vias and other structures to extend through the respective planes to facilitate connection of conductors between various planes for various purposes as will be described.

The circuit board 100 also includes a via 143 that is coupled to each of the conductors that make up the ground planes 133. In this respect, the via 143 is a "ground via" as can be appreciated. The ground via 143 terminates into the via signal launch pad 113 for coupling to a ground conductor of a test probe.

The circuit board 100 also includes a number of antipads 146 that are positioned between the surface pads 103 and a select one of the ground conductors that makes up one of the ground planes 133 as described above. In this respect, at least a portion of the select ground conductor 149 is parallel to and collateral to the at least one surface pad 103. In this respect, the term "collateral" is defined herein as being situated or running side by side. In this respect, at least a portion of the ground conductor 149 is both parallel to and faces a surface pad 103.

Antipads are defined herein as defined voids in which a conductor is eliminated within a larger conductive area associated with a given plane of the circuit board 100. According to one embodiment of the present invention, a number of antipads are disposed in the respective planes falling between the surface pads 103 and the select ground conductor 149. Such planes falling between the surface pads 103 and the select ground conductors 149 are designated herein as "intermediate planes" 153.

According to one embodiment, the antipads are located in the intermediate planes 153, if necessary, so as to fall directly between the surface pads 103 and the ground conductor 149. If the given intermediate plane 153 does not have a conductor in the area falling between the surface pads 103 and the ground conductor 149, then a corresponding antipad is not needed.

Due to the location of the antipads in each one of the intermediate planes 153 positioned between the surface pad 103 and the select ground conductor 149, a non-conductive volume extends from the surface pad 103 to the ground conductor 149 through the antipads 146. In this respect, a ground clearance GC is created between the surface pad 103 and the select ground conductor 149. The size of the ground clearance GC dictates the characteristic impedance of the surface pads 103 themselves. In order to prevent reflections at the junctions of the cable conductors 126 and the surface pads 103, the ground clearance GC is specified so that the characteristic impedance of the surface pads 103 approximately matches the characteristic impedance of the cable 123 to the greatest extent possible.

In order to determine the optimal ground clearance between the surface pads 103 and the ground conductor 149 resulting in a characteristic impedance that most closely matches the characteristic impedance for a given cable 123, field analysis may be performed based upon the geometry presented by the surface pads 103 and the ground conductor 149. Specifically, the field analysis may be performed using various tools such as, for example, the Maxwell 2D V10 tool for electromagnetic field analysis, or the HFSS™ V9.0 3-dimensional electromagnetic simulation software tool, both created by Ansoft Corporation with headquarters in Pittsburg, Pa. Also, the field analysis may be performed using CST MICROWAVE STUDIO™ tool for 3 dimensional electromagnetic simulation created by Computer Simulation Technology with headquarters in Wellesley Hills, Mass.

The ground clearance GC may extend through any number of intermediate planes 153 of the circuit board 100. To the extent that such intermediate planes 153 would normally include a conductor that extended between the surface pads 103 and the ground conductor 149, then an antipad is properly located there between. Thus, given the characteristic impedance of a given cable 123 to be tested, the circuit board 100 may be designed so that the surface pads 103 have a characteristic impedance that approximately matches the characteristic impedance of the cable 123 the extent possible.

Figure 3:
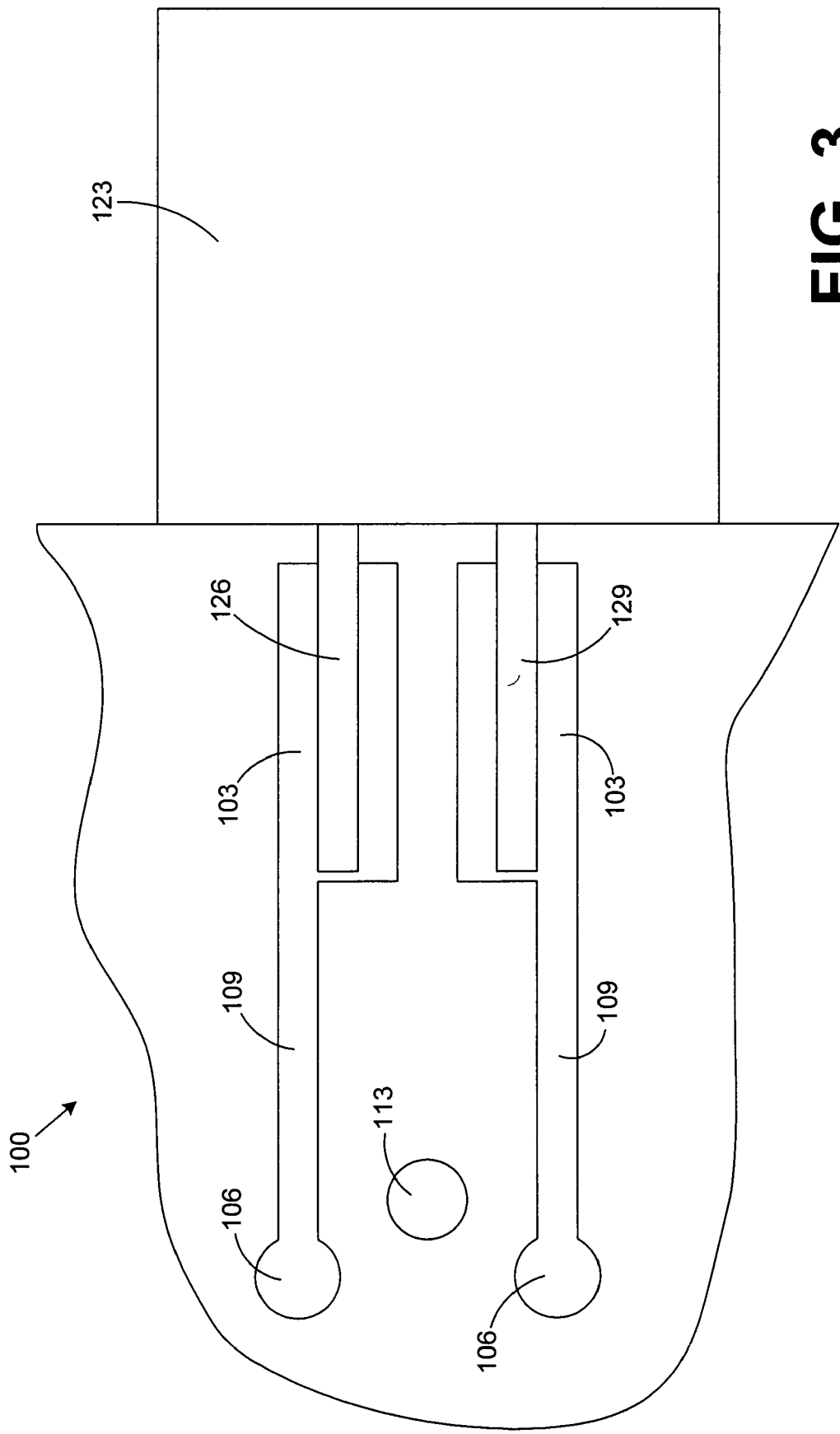
FIG. 3 is a drawing of a coupling of conductors of a cable to the surface pads of the section of the circuit board of FIG. 1 according to an embodiment of the present invention.

With reference to FIG. 3, shown is a top view of the assembly of the circuit board 100 and the cable 123 according to an embodiment of the present invention. As shown, the cable conductors 126 are mounted on to the surface pads 103. Specifically, the cable conductors 126 may be mounted to the surface pads 103 using solder or other connection. If soldering is used, then the junction between the cable conductors 126 and the surface pads 103 should be clean with as little solder as possible. This is done so as to minimize the amount of capacitance created by the junction between the surface pads 103 and the cable conductors 126 and to avoid significantly altering the characteristic impedance of the surface pads 103 relative to the characteristic impedance of the cable 123. While the assembly of the circuit board 100 and the cable 123 is shown with cable conductors 126 being coupled to the surface pads 103 in a side by side orientation, it is understood that according other embodiments, geometries and/or orientations may be employed that differ from those shown while, at the same time, employing the concepts described herein.

Figure 4:
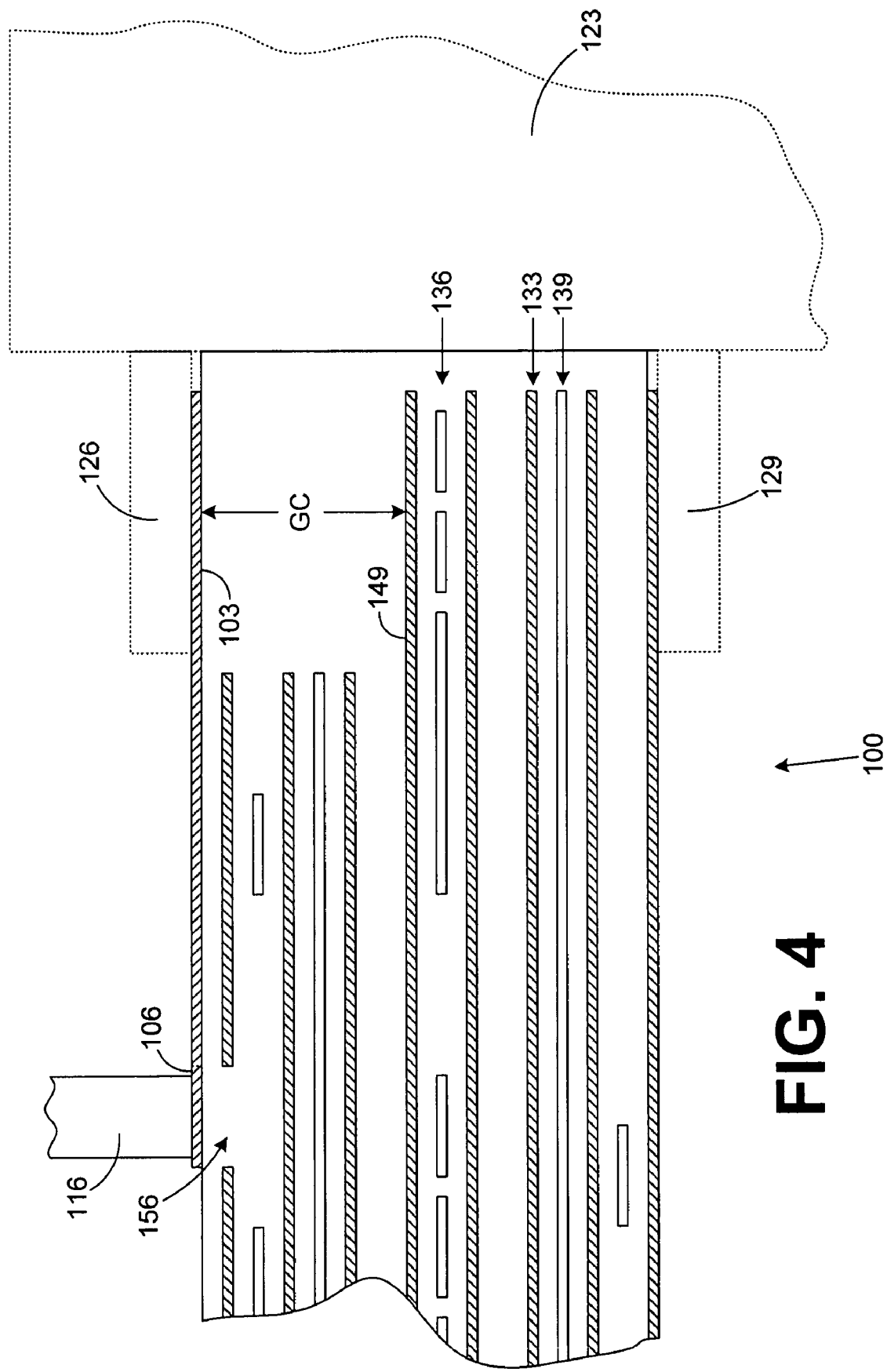
FIG. 4 is a drawing of a second cross-section of the section of the circuit board of FIG. 1 according to an embodiment of the present invention.

Referring next to FIG. 4, shown is a cutaway view of the section of the circuit board 100 taken across the section line BB (FIG. 1) according to an embodiment of the present invention. As shown, the ground clearance GC between the surface pads 103 and the select ground conductor 149 is shown. In addition, a ground clearance 156 is also located under the signal launch pad 106. In this respect, one or more antipads may be collocated in a parallel and collateral orientation with respect to the signal launch pads 106. The ground clearance 156 may be determined in the same manner as described above with respect to the ground clearance GC. Also, there may be any number of intermediate layers within which an antipad is located under the signal launch pads 106.

Figure 5:
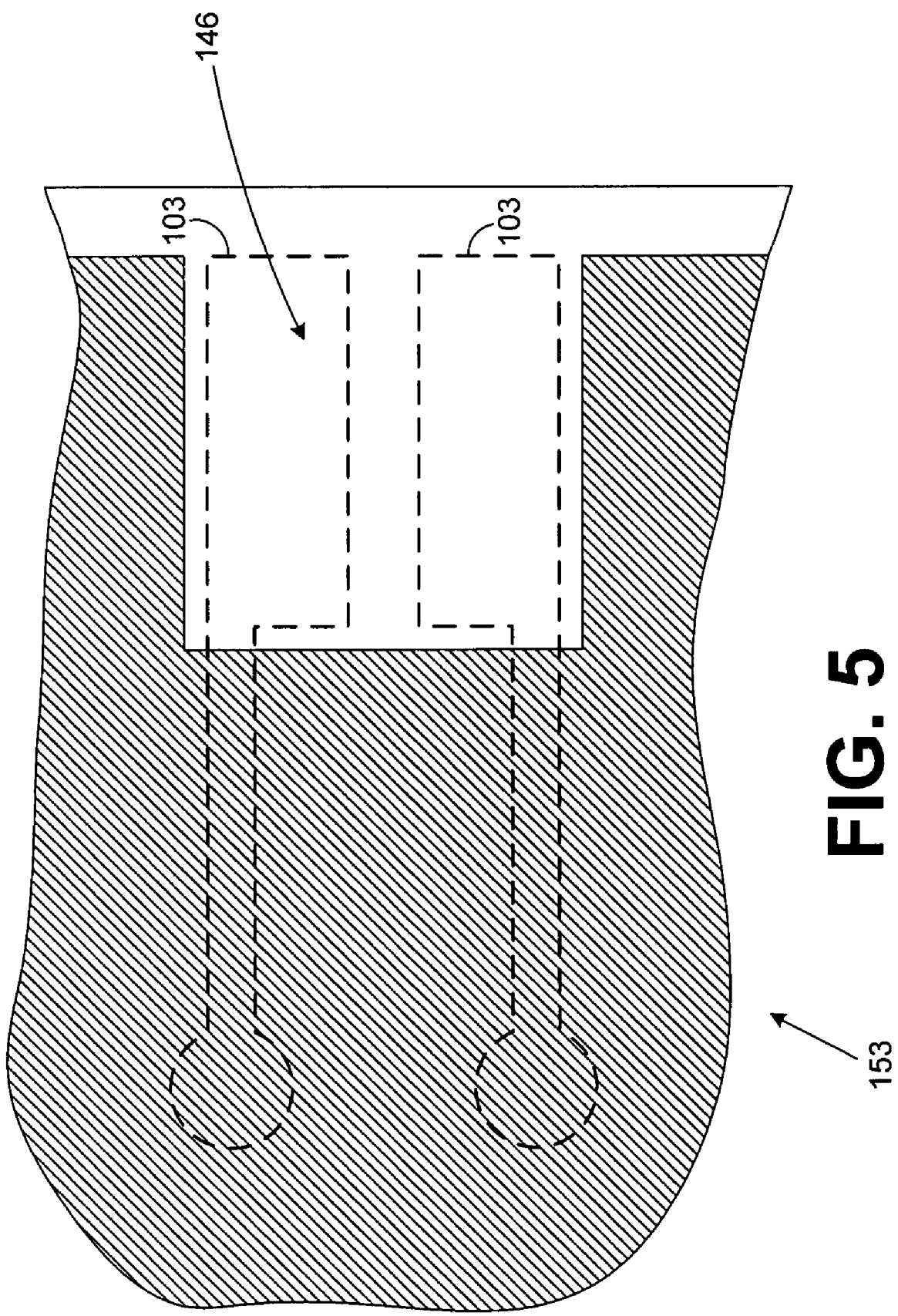
FIG. 5 is a drawing of an antipad positioned relative to the surface pads of the section of the circuit board of FIG. 1 according to an embodiment of the present invention.

With reference to FIG. 5, shown is a view of an intermediate plane 153 that includes a conductor with an antipad 146 that is located between the surface pads 103 and the ground conductor 149 (FIG. 2). In this respect, the conductor may be, for example, a conductor that is a portion of a ground plane 133, a signal plane 136, or a power plane 139 as described above. As shown, the antipad 146 includes a profile that coincides with the outlines of the surface pads 103 shown in phantom in FIG. 5. In addition, the antipad 146 may be slightly larger than the area bounded by the surface pads 103 so as to ensure that the conductor of the intermediate plane 153 does not impact the characteristic impedance associated with the surface pads 103 in an undesirable manner.

Figure 6:
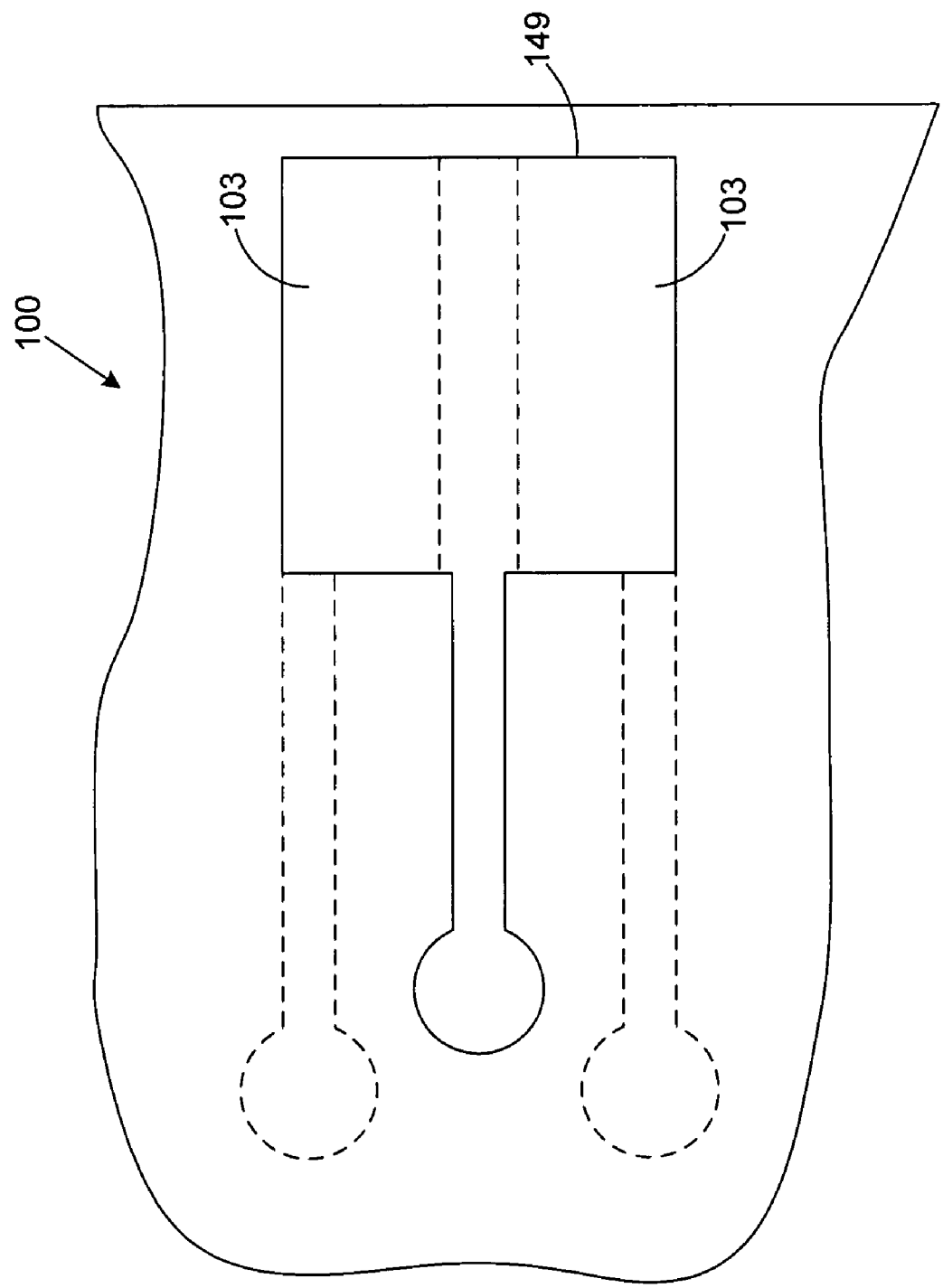
FIG. 6 is a drawing of a ground conductor in the section of the circuit board of FIG. 1 positioned relative to the surface pads according to an embodiment of the present invention.

Referring next to FIG. 6, shown is the ground plane associated with the selected ground conductor 149 (FIG. 2) according to an embodiment of the present invention. In this respect, the selected ground conductor 149 that resides in the respective ground plane may or may not be a ground conductor that extends across the entire area of a circuit board 100. Specifically, the selected ground conductor 149 may have a profile, for example, that generally coincides with the profile of the one or more surface pads 103 as shown in FIG. 6. Thus, the select ground conductor 149 may comprise a sheet ground plane that generally extends across the entire area of the circuit board 100, or the select ground conductor 149 may be a conductor that is carved out of such a layer with a predefined profile as described with reference to FIG. 6.

Next, a discussion of a method for launching a signal into the cable 123 as described above is provided. First, one or more cable conductors 126 are electrically coupled to a corresponding one or more surface pads 103 as shown with reference to FIG. 2. Also, a ground conductor 129 of the cable 123 is electrically coupled to a ground conductor of the circuit board 100 that is located on the remaining surface of the circuit board 100. An impedance mismatch is minimized between the cable 123 and the circuit board 100 by providing a second ground conductor in the circuit board 100 that is parallel to and collateral to the surface pad 103. The second ground conductor is the ground conductor 149 within the circuit board 100 that faces the surface pad 103. Also, at least one antipad 146 is positioned between the surface pad 103 and the ground conductor 149, thereby allowing a nonconductive volume to extend from the surface pad 103 to the select ground connector 149 through the antipad 146.

In addition, the conductors of the test probe 116, 119 are coupled to the signal launch pads 106 and the ground signal launch pad 113. A test signal is launched into the cable through the test probe and the conductors on the circuit board, including the launch pads 106/113, the leads 109, and the surface pads 103.

Figure 7:
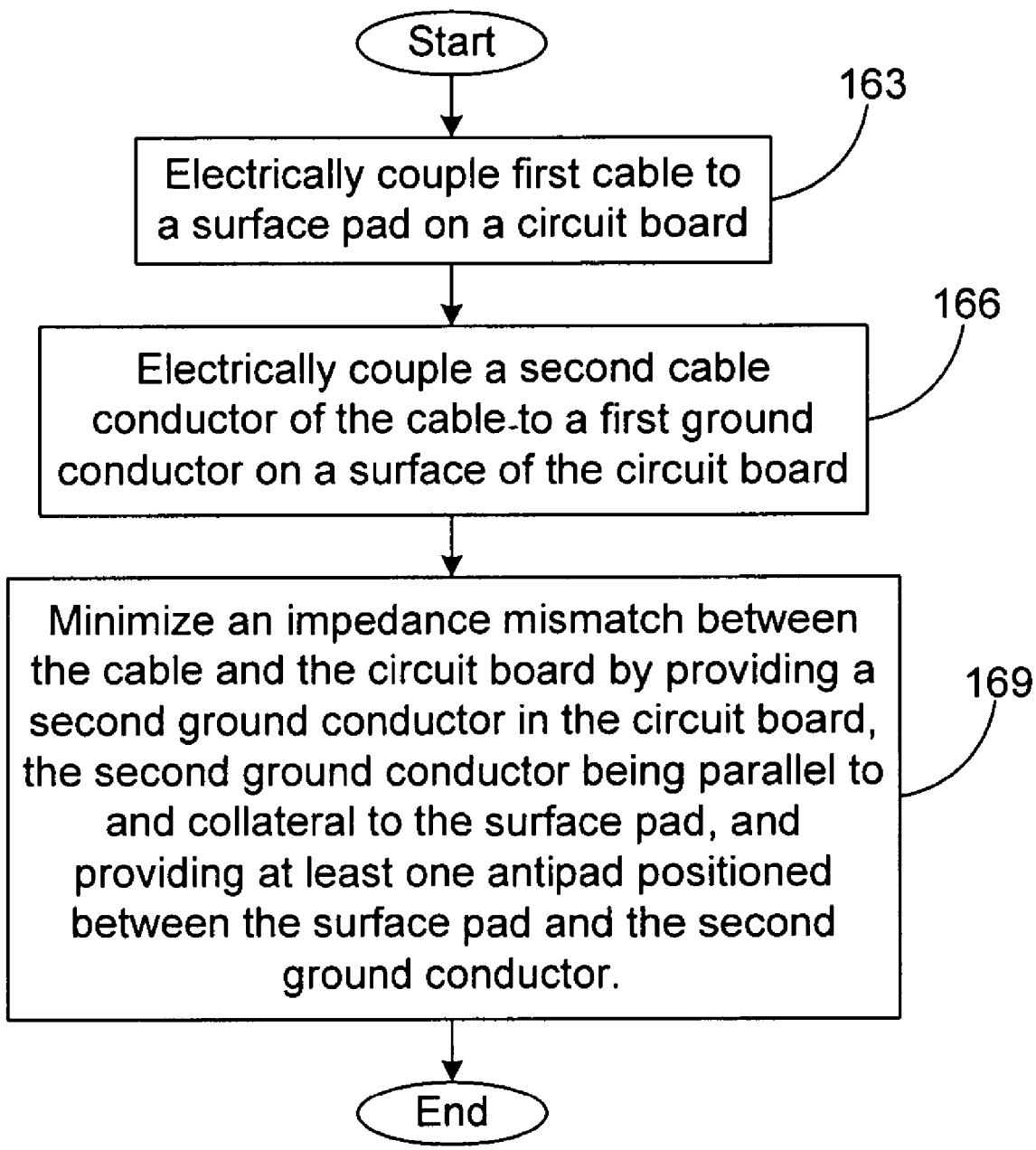
FIG. 7 is a drawing of a flow chart depicting a method according to one embodiment of the present invention.

With reference to FIG. 7, shown is a flow chart of an example of a method for launching a signal into a cable according one embodiment of the present invention. In the embodiment shown in FIG. 7, beginning at block 163, a first cable conductor of a cable 123 (FIG. 2) is electrically coupled to a surface pad 103 (FIG. 2) on a circuit board 100 (FIG. 2). Next, in box 166, a second cable conductor of the cable 123 is electrically coupled to a first ground conductor on a surface of the circuit board 100. In box 167, an impedance mismatch is minimized between the cable 123 and the circuit board 100 by providing a second ground conductor in the circuit board 100, the second ground conductor being parallel to and collateral to the surface pad 103, and providing at least one antipad 146 positioned between the surface pad 103 and the second ground conductor, wherein a nonconductive volume extends from the surface pad 103 to the second ground conductor through the at least one antipad 146, and the first ground conductor is electrically coupled to the second ground conductor.

In other embodiments, the method further comprises the steps of disposing the at least one antipad 146 on a ground plane, and/or disposing the at least one antipad 146 on a power plane. In another embodiment, where the surface pad 103 is coupled to a signal launch pad, the method further comprising the steps of attaching a test probe to the signal launch pad, and launching a test signal into the cable through the test probe. In another embodiment, the method comprises the step of electrically coupling the first ground conductor to the second ground conductor through a via in the circuit board 100.

Although the invention is shown and described with respect to certain embodiments, it is obvious that equivalents and modifications will occur to others skilled in the art upon the reading and understanding of the specification. The present invention includes all such equivalents and modifications, and is limited only by the scope of the claims.

What is claimed is:

1. A circuit board, comprising:
at least one surface pad located on a surface of the circuit board and connected to an external cable;
plural ground conductors in the circuit board, the around conductors being parallel to and collateral to the at least one surface pad; and
at least one antipad positioned between the at least one surface pad and at least one of the ground conductors, wherein a nonconductive volume extends from the surface pad to the at least one ground conductor through the at least one antipad so an impedance of the at least one surface pad at least approximately matches an impedance of the external cable, and the antipad is located in the nonconductive volume where at least two parallel ground conductors have portions removed.

2. The circuit board of claim 1, wherein
the at least one ground conductor is situated in a ground plane in the circuit board; and
wherein the antipad is disposed in an intermediate plane, the intermediate plane being between the surface and the ground plane.

3. The circuit board of claim 2, wherein the intermediate plane further comprises a ground plane.

4. The circuit board of claim 2, wherein the intermediate plane further comprises a power plane.

5. The circuit board of claim 2, further comprising a profile of the at least one ground conductor in the ground plane coincides with a profile of the at least one surface pad in the surface.

6. The circuit board of claim 1, further comprising a signal launch pad on the surface, the signal launch pad being electrically coupled to the at least one surface pad.

7. The circuit board of claim 6, further comprising:
a ground signal pad on the surface; and
a ground via extending through the circuit board, the ground via electrically coupling the at least one ground conductor to the ground signal pad.

8. A circuit board, comprising:
surface pad means for mounting a first conductor of a cable on a surface of the circuit board;
plural ground conductors in the circuit the ground conductors being parallel to and collateral to the at least one surface pad; and
means for minimizing an impedance mismatch between the cable and the circuit board including at least one antipad positioned between the at least one surface pad means and at least one of the ground conductors, wherein a nonconductive volume extends from the surface pad mean to the a least one ground conductor through the at least one antipad, and the antipad is located in the nonconductive volume where at least two parallel ground conductors have portions removed.

9. The circuit board of claim 8, wherein
the at least one ground conductor is situated in a ground plane in the circuit board; and
wherein the means for minimizing an impedance mismatch comprises the at least one antipad being disposed in an intermediate plane, the intermediate plane being between the surface and the ground plane.

10. The circuit board of claim 9, wherein the intermediate plane further comprises a ground plane.

* * * * *

UNITED STATES PATENT AND TRADEMARK OFFICE
CERTIFICATE OF CORRECTION

PATENT NO. : 7,307,220 B2  
APPLICATION NO. : 11/034072  
DATED : December 11, 2007  
INVENTOR(S) : Christopher M. Barnette It is certified that error appears in the above-identified patent and that said Letters Patent is hereby corrected as shown below:

In column 6, line 1, in Claim 1, delete "around" and insert -- ground --, therefor.

In column 6, line 40, in Claim 8, after "circuit" insert -- board, --.

In column 6, line 48, in Claim 8, after "the" delete "a" and insert -- at --, therefor.

Signed and Sealed this

Twenty-seventh Day of May, 2008

JON W. DUDAS  
*Director of the United States Patent and Trademark Office*